United States Patent
Otterstedt et al.

(10) Patent No.: US 9,032,273 B2
(45) Date of Patent: May 12, 2015

(54) METHOD, APPARATUS AND DEVICE FOR DATA PROCESSING

(71) Applicant: Infineon Technologies AG, Neubiberg (DE)

(72) Inventors: Jan Otterstedt, Unterhaching (DE); Rainer Goettfert, Putzbrunn (DE)

(73) Assignee: Infineon Technologies AG, Neubiberg (DE)

( * ) Notice: Subject to any disclaimer, the term of this patent is extended or adjusted under 35 U.S.C. 154(b) by 77 days.

(21) Appl. No.: 14/018,811

(22) Filed: Sep. 5, 2013

(65) Prior Publication Data

US 2015/0067447 A1    Mar. 5, 2015

(51) Int. Cl.
| | |
|---|---|
| *G06F 11/10* | (2006.01) |
| *H03M 13/19* | (2006.01) |
| *H04L 1/00* | (2006.01) |
| *H03M 13/29* | (2006.01) |
| *H03M 13/11* | (2006.01) |
| *H03M 13/03* | (2006.01) |

(52) U.S. Cl.
CPC ....... *G06F 11/1008* (2013.01); *H03M 13/2906* (2013.01); *H03M 13/1174* (2013.01); *G06F 11/1024* (2013.01); *G06F 11/1048* (2013.01); *G06F 11/1068* (2013.01); *H03M 13/03* (2013.01); *H03M 13/19* (2013.01); *H04L 1/0057* (2013.01)

(58) Field of Classification Search
CPC . H03M 13/19; H03M 13/1174; H03M 13/03; H03M 13/2906; H04L 1/0057; G06F 11/1008; G06F 11/1068; G06F 11/1024; G06F 11/1048; G11C 16/044
See application file for complete search history.

(56) References Cited

U.S. PATENT DOCUMENTS

| | | | | |
|---|---|---|---|---|
| 4,037,091 | A * | 7/1977 | Beuscher | 714/758 |
| 7,894,261 | B1 * | 2/2011 | Pesavento | 365/185.05 |
| 2005/0152459 | A1 * | 7/2005 | Lobo et al. | 375/240.28 |
| 2014/0192603 | A1 * | 7/2014 | Singh | 365/203 |

OTHER PUBLICATIONS

Wikipedia, "Hamming Code." Article dated Aug. 14, 2013. Retrieved from http:llen.wikipedia.orglwikilHamming_code 8 Pages.*
"Hamming Code." Article dated Aug. 14, 2013. Retrieved from http://en.wikipedia.org/wiki/Hamming_code 8 Pages.

* cited by examiner

*Primary Examiner* — John P Trimmings
(74) *Attorney, Agent, or Firm* — Eschweiler & Associates, LLC (57) ABSTRACT

An embodiment relates to a method for data processing that includes reading data, the data comprising overhead information and payload information, and determining a state of each portion of the data, wherein the state is one of a first binary state, a second binary state, and an undefined state. The method also includes decoding at least one portion of data that has an undefined state based on its location and based on the overhead information.

25 Claims, 3 Drawing Sheets

| cell_t | cell_c | data bit | |
|---|---|---|---|
| Icell_t >> 0 µA | I cell_c >> 0 µA | undefined → 'X' | both cells erased |
| Icell_t >> 0 µA | I cell_c = ~0 µA | '0' | complementary cells |
| Icell_t = ~0 µA | I cell_c >> 0 µA | '1' | complementary cells |
| Icell_t = ~0 µA | I cell_c = ~0 µA | undefined → 'X' | both cells written |

| cell_t1 | cell_t2 | data bit | |
|---|---|---|---|
| Icell_t >> 0 µA | I cell_c >> 0 µA | '0' | both cells erased |
| Icell_t >> 0 µA | I cell_c = ~0 µA | undefined → 'X' | complementary cells |
| Icell_t = ~0 µA | I cell_c >> 0 µA | undefined → 'X' | complementary cells |
| Icell_t = ~0 µA | I cell_c = ~0 µA | '1' | both cells written |

Fig.1A

| cell_t | cell_c | data bit | |
|---|---|---|---|
| Icell_t >> 0 µA | Icell_c >> 0 µA | undefined → 'X' | both cells erased |
| Icell_t >> 0 µA | Icell_c = ~0 µA | '0' | complementary cells |
| Icell_t = ~0 µA | Icell_c >> 0 µA | '1' | complementary cells |
| Icell_t = ~0 µA | Icell_c = ~0 µA | undefined → 'X' | both cells written |

Fig.1B

| cell_t1 | cell_t2 | data bit | |
|---|---|---|---|
| Icell_t >> 0 µA | Icell_c >> 0 µA | '0' | both cells erased |
| Icell_t >> 0 µA | Icell_c = ~0 µA | undefined → 'X' | complementary cells |
| Icell_t = ~0 µA | Icell_c >> 0 µA | undefined → 'X' | complementary cells |
| Icell_t = ~0 µA | Icell_c = ~0 µA | '1' | both cells written |

Fig.2

| | Parity Code | Hamming Code | Extended Hamming Code |
|---|---|---|---|
| overhead bits | 1 | $\lceil \ln(n+1) \rceil$ | $\lceil \ln(n+1) \rceil + 1$ |
| Without undefined bit(s) 'X' | | | |
| corrected cases | | f | f |
| detected cases | f | | ff |
| With undefined bit(s) 'X' | | | |
| corrected cases | x | f, x, xx | f, x, xx, fx, xxx |
| detected cases | f, xx, xxx, ... | xxx, xxxx, ...<br>fxxx, fxxxx, ...<br>ffxxx, ffxxxx, ...<br>... | ff, fxx, xxxx, xxxxx, ...<br>fxxxx, fxxxxx, ...<br>ffxxxx, ffxxxxx, ...<br>... | f = flipped bit ('0'→'1' or '1'→'0')
x = undefined bit 'X'
ff = 2 flipped bits
fx = one flipped bit and one undefined bit
xx = 2 undefined bits
xxx = 3 undefined bits
...

| For differential read NVM | Parity Code | Hamming Code | Extended Hamming Code |
|---|---|---|---|
| overhead bits | 1 | $\lceil \ln(n+1) \rceil$ | $\lceil \ln(n+1) \rceil + 1$ |
| | Without undefined bit(s) 'X' | | |
| corrected cases | - | any 1 cell pair failure | any 1 cell pair failure |
| detected cases | any 1 cell pair failure | - | any 2 cell pair failures |
| | With undefined bit(s) 'X' | | |
| corrected cases | any 1 cell failure | any ≤2 cell failures | any ≤3 cell failures |
| detected cases | any 2 cell failures + all multiple cell failures, with ≥2 'X' | all multiple cell failures, with ≥3 'X' | any 4 cell failures + all multiple cell failures, with ≥4 'X' |

Fig.3

METHOD, APPARATUS AND DEVICE FOR DATA PROCESSING

FIELD

Embodiments of the present disclosure relate to an extension of error detection and correction, utilizing and enhancing in particular error correction mechanisms and codes.

SUMMARY

A first embodiment relates to a method for data processing comprising reading data, the data comprising overhead information and payload information, and determining a state of each portion of the data, wherein the state comprises at least one of a first binary state, a second binary state, and an undefined state. The method further comprises decoding at least one portion of data that has an undefined state based on its location and based on the overhead information.

A second embodiment relates to an apparatus for data processing, wherein the device comprises a processing unit configured to read data, the data comprising overhead information and payload information. The processing unit is further configured to determine a state of each portion of the data, wherein the state comprises at least one of a first binary state, a second binary state, and an undefined state. The processing unit is still further configured to decode at least one portion of data that has an undefined state based on its location and based on the overhead information.

A third embodiment relates to a device for data processing, in particular error detection and error correction. The device comprises means for reading data, the data comprising overhead information and payload information, and means for determining a state of each portion of the data, wherein the state comprises at least one of a first binary state, a second binary state, and an undefined state. The device further comprises means for decoding at least one portion of data that has an undefined state based on its location and based on the overhead information.

BRIEF DESCRIPTION OF THE DRAWINGS

Embodiments are shown and illustrated with reference to the drawings. The drawings serve to illustrate the basic principle, so that only aspects necessary for understanding the basic principle are illustrated. The drawings are not to scale. In the drawings the same reference characters denote like features.

DETAILED DESCRIPTION

The examples presented in particular refer to memories with the feature of an undefined bit indication during a read. Such memories—when read—not only indicate the two binary states "0" and "1" for each bit, but additionally generate an indication "X" for an undefined bit, i.e. a bit where no valid information can be found or the read result was (too) uncertain.

This additional information given by the indication "X" may be utilized to optimize the error correcting code.

The examples may be applied to non-volatile memories (NVMs) with a differential read. However, the concept may be used in combination with any memory or even to any data set send over a bus etc., where an additional undefined bit indication can be utilized.

The introduction of a differential read in an NVM improves reliability, e.g., even after a high number of write/erase cycles, but requires two NVM cells (also referred to as a cell pair) per data bit.

Figure 1A:
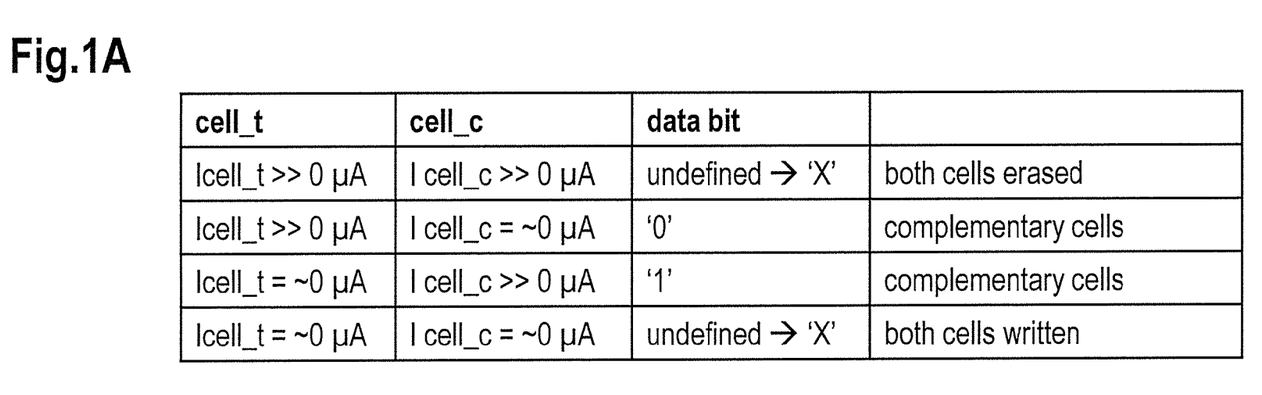
FIG. 1A and FIG. 1B each shows a table summarizing potential states "0", "1" and "X" of a cell pair of a differential read memory device.
Figure 1B:
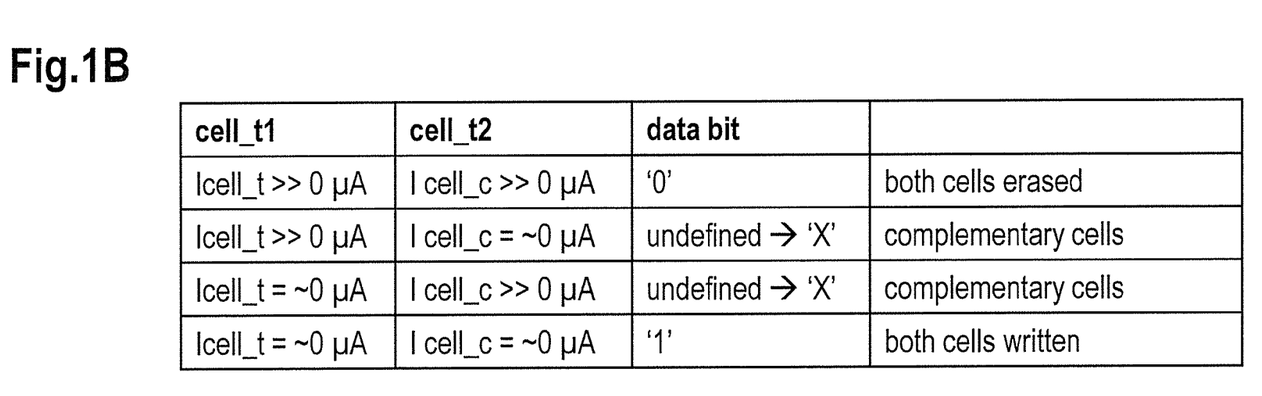

Depending on the states of the two cells of the pair (i.e., a cell_t and a cell_c, with t=true and c=complement) a state of a stored data bit may be determined based on the table shown in FIG. 1A. FIG. 1B shows an alternative example of a different coding scheme. In the following the coding scheme according to the example shown in FIG. 1A is used.

Hence, normally the two associated NVM cells of a memory store complimentary information, i.e. they have opposite states. As shown in FIG. 1, only a bit that has complementary cells can be successfully decoded, i.e. one of the two cells of a cell pair has to be in the written state and the other cell has to be in the erased state to allow for successful data decoding.

In case of an error, one of the cells may have flipped its state (or the read-out of one of the cells has been disturbed to the effect that it looks like the cell has flipped its state), which may lead to a decoded "X" state. It is noted that both cells may have flipped their states into opposite directions and thus the bit data is inverted. This scenario is discussed below.

Without the "X" indication, a random value out of ["0", "1"] is read for a failing bit and a subsequent ECC unit may be used to determine the position of the failing bit and its correct value.

According to an example provided herein, utilizing the "X" allows identifying the location of the failing bit. This knowledge can be used for an improved ECC with less overhead or for higher correction capabilities.

As example embodiments, three different ECC types will be introduced. However, the solution suggested may be used for such embodiments and for other implementations in order to improve correction capabilities:

(a) Parity check with 1-undefined-bit correction capability:

With a conventional coding scheme using only "1" and "0", a parity code is merely able to detect that a single bit is flipped; based on the approach described herein utilizing the undefined bit "X" state, additionally the single undefined bit can be corrected.

(b) Hamming Code with 2-undefined-bits correction capability:

With a conventional coding scheme using only "1" and "0", a Hamming Code is merely able to correct a single flipped bit; based on the approach described herein, in additional cases one or two undefined bits can be corrected.

(c) Extended Hamming Code with 3-undefined-bits correction capability:

With a conventional coding scheme using only "1" and "0", an extended Hamming Code is only able to correct a single flipped bit and detect that two bits are flipped; based on the approach described herein, in additional cases one, two, or three undefined bits or a flipped bit plus one undefined bit can be corrected.

Hereinafter, as example use cases, the three different ECC types will be discussed in further detail.

Parity Check With Correction Capability for 1 Undefined Bit

When writing a k-bits data word $D=(d_0 \ldots d_{k-1})$ into the memory, additionally one extra bit $r_0=\text{Parity}(D)$ is written. Overall, $n=k+1$ bits are stored.

When reading a data word D from the memory, all n bits of $Y=(d_0 \ldots d_{k-1}, r_0)$ are read, each bit resulting in a value out of ["0", "1", "X"]. In this regard, Y comprises the data word D and the extra bit (parity information).

If all n bits of Y have values out of ["0", "1"] then the following applies:
  if $r_0=\text{Parity}(D)$, then data $D=(d_0 \ldots d_{k-1})$ is assumed to be correct; else an unrecoverable data error may be indicated.

If k−1 bits out of the bits $d_0 \ldots d_{k-1}$ plus $r_0$ have values from ["0", "1"] and if one bit $d_f$ is "X", then $d_f'=\text{Parity}(d_0 \ldots d_{k-1}, r_0)|_{d_f=0}$ is set and data $D'=(d_0 \ldots d_f' \ldots d_{k-1})$ is assumed to be correct.

If all bits of $d_0 \ldots d_{k-1}$ have values out of ["0", "1"] and $r_0$ is "X", then data $D=(d_0 \ldots d_{k-1})$ is assumed to be correct.

If more than one bit of Y has a value "X", then an unrecoverable data error may be indicated.

A data word that is read with more than one flipped bit=["0", "1"] may exhaust the ECC mechanism and lead to wrong data without the bits being indicated. Also, a data word read with a single flipped bit=["0", "1"] and one undefined bit "X" may exhaust the ECC mechanism and lead to wrong data without the bits being indicated.

In the following, a parity check example is provided with k=8 bits of the data word and n=9 bits stored. The data word is
$D=(1\ 0\ 0\ 0\ 0\ 0\ 0\ 0)$
and the parity bit $r_0=1$, which may lead to the following cases:

(1) Case 1: The following information is read:
$Y=(1\ 0\ 0\ 0\ 0\ 0\ 0\ 0\ 1)$
The parity information of the data word read is determined as follows:
$\text{Parity}(1\ 0\ 0\ 0\ 0\ 0\ 0\ 0)=1$
which corresponds to the parity bit $r_0$. Hence, no correction is necessary.

(2) Case 2: The following information is read:
$Y=(1\ 0\ 1\ 0\ 0\ 0\ 0\ 0\ 1)$,
wherein the third bit (bit 2, because the first bit is denoted bit 0) amounting to "1" is an error. The parity information of the data word read is determined as follows:
$\text{Parity}(1\ 0\ 0\ 0\ 0\ 0\ 0)=0$
which is different from $r_0$. Hence, an unrecoverable error is detected.

(3) Case 3a: The following information is read:
$Y=(1\ X\ 0\ 0\ 0\ 0\ 0\ 0\ 1) \rightarrow f=1$
indicating an undefined bit "X" at the position f=1 (the second position of the data word). If the bit at the position f=1 is set to "0", a corrected data word D' can be obtained as follows:
$d_f=\text{Parity}(1\ 0\ 0\ 0\ 0\ 0\ 0\ 0\ 1)=0$
$D'=(1\ 0\ 0\ 0\ 0\ 0\ 0\ 0)$.
It is noted that the bit at the position f=1 set to "1" would not result in the parity bit $r_0$ being 1, which only leaves the possibility to set bit 1 at the position f=1 to "0".

(4) Case 3b: The following information is read:
$Y=(X\ 0\ 0\ 0\ 0\ 0\ 0\ 0\ 1) \rightarrow f=0$
indicating an undefined bit "X" at the position f=0 (the first position of the data word). If only bit 0 at the position f=0 is set to "1", a corrected data word D' can be obtained as follows:
$d_f=\text{Parity}(0\ 0\ 0\ 0\ 0\ 0\ 0\ 0\ 1)=1$
$D'=(1\ 0\ 0\ 0\ 0\ 0\ 0\ 0)$.

(5) Case 4: The following information is read:
$Y=(X\ 0\ 0\ 0\ 0\ 0\ 0\ X\ 1)$
indicating an undefined bit "X" at the position f=0 and another undefined bit "X" at the position f=7 of the data word D. As there is only a single parity bit $r_0$, this error cannot be resolved. It can, however, be detected due to the fact that the undefined bits "X" are detected.

Hamming Code With Correction Capability for 2 Undefined Bits

For details regarding the Hamming Code, reference is made, e.g., to http://en.wikipedia.org/wiki/Hamming_code.

In this example scenario, a systematic Hamming Code is used with
  a generator matrix $\underline{A}$ of the Hamming Code;
  a parity check matrix $\underline{H}$ of the Hamming Code, wherein $\underline{H}=[\underline{A}\ I]$ with I being the identity matrix.

When writing a k-bits data word $D=(d_0 \ldots d_{k-1})$ into the memory, r extra bits $R=(r_0 \ldots r_{r-1})$ are written. Overall, $n=k+r$ bits are stored.

The r extra bits (i.e. number of overhead bits) correspond to the condition:

$$r \geq \lceil ln(n+1) \rceil = \lceil ln(k+r+1) \rceil$$

Typically, the following applies:

$$r = \lceil ln(n+1) \rceil = \lceil ln(k+r+1) \rceil$$

In addition, the following definition may apply:
$R=D\ \underline{A}^T$.

When reading a data word D from the memory, all n bits of
$Y=(d_0 \ldots d_{k-1}, r_0 \ldots r_{r-1})$
are read, each resulting in a value out of ["0", "1", "X"].

If all n bits of Y have values out of ["0", "1"] the followings applies:
  if a syndrome
  $S=\underline{H}\ Y^T==0$,
  then data $D=(d_0 \ldots d_{k-1})$ is assumed to be correct.
  else: if the syndrome $S \neq 0$ is equal to a column i of $\underline{H}$, then a single flipped bit is assumed and corrected by inverting bit i of Y.
  else: the syndrome $S \neq 0$ is not equal to any column of $\underline{H}$, an unrecoverable data error may be indicated. This may be an option for shortened codes.

If n−1 bits out of Y have values out of ["0", "1"] and one bit $y_f$ (at the position f) is "X", the following applies:
  if the syndrome
  $S=\underline{H}\ Y^T|_{y_f=0}==0$,
  then $y_f'=0$ is set,
  else: if the syndrome $S \neq 0$ is equal to column f of $\underline{H}$, then $y_f'=1$ is set,
  else: an unrecoverable data error may be indicated. This may be an option for shortened codes.
  corrected data $D'=$first k bits of $Y'=(y_0 \ldots y_f' \ldots y_{n-1})$ is assumed to be correct.

Alternatively: If n−1 bits out of Y have values out of ["0", "1"] and one bit $y_f$ (at position f) is "X", the following applies:
  if the syndrome
  $S=\underline{H}\ Y^T|_{y_f=1}==0$,
  then $y_f'=1$ is set,
  else: if the syndrome $S \neq 0$ is equal to column f of $\underline{H}$, then $y_f'=0$ is set,
  else: an unrecoverable data error may be indicated. This may be an option for shortened codes.
  corrected data $D'=$first k bits of $Y'=(y_0 \ldots y_f' \ldots y_{n-1})$ is assumed to be correct.

In addition or as another alternative, the following scenario may be considered: If n−1 bits out of Y have values out of ["0", "1"] and one bit $y_f$ (at position f) is "X", the following applies:

successively (e.g., in a loop), $y_f$ is set to all possible values sv out of ["0", "1"],
if the syndrome
$S=\underline{H}\,Y^T|_{yf=sv}=0$,
then $y_f'=sv$ is set and the loop may be terminated,
else: the next value sv for $y_f$ is selected as long as not all values sv have been tried,
if no suitable sv could be found via the iterations selecting different values sv for $y_f$, an unrecoverable data error may be indicated. This may be an option for shortened codes.
corrected data D'=first k bits of Y'=$(y_0 \ldots y_f' \ldots y_{n-1})$ is assumed to be correct.

It is noted that in the following the respective alternatives with setting $y_f=1$ or combinations with $y_{f1}=1$ or $y_{f2}=1$ or $y_{f3}=1$ are not described in further detail. Accordingly, it is not described selecting all possible combinations of $y_{f1}$ and $y_{f2}$ or $y_{f1}$, $y_{f2}$, and $y_{f3}$. However, such settings may be used to determine whether the syndrome S equals 0.

If n−2 bits out of Y have values out of ["0", "1"] and two bits $y_{f1}$ and $y_{f2}$ (at positions f1 and f2, respectively) are "X", the following applies:

if the syndrome
$S=\underline{H}\,Y^T|_{yf1=yf2=0}=0$, then $y_{f1}'=y_{f2}'=0$ are set,
else: if the syndrome $S \neq 0$ is equal to column f1 of $\underline{H}$, then $y_{f1}'=1$ and $y_{f2}'=0$ are set,
else: if the syndrome $S \neq 0$ is equal to column f2 of $\underline{H}$, then $y_{f1}'=0$ and $y_{f2}'=1$ are set,
else: if the syndrome $S \neq 0$ is equal to the modulo-2 sum of columns f1 and f2 of $\underline{H}$, then $y_{f1}'=y_{f2}'=1$ are set,
else an unrecoverable data error may be indicated. This may be an option for shortened codes.
corrected data D'=first k bits of Y'=$(y_0 \ldots y_{f1}' \ldots y_{f2}' \ldots y_{n-1})$ is assumed to be correct.

If more than 2 bits out of Y are undefined bits "X", then an unrecoverable data error may be indicated.

A read data word with more than one flipped bit out of ["0", "1"] may exhaust the ECC mechanism and lead to wrong data without being indicated. A read data word with one flipped bit out of ["0", "1"] and one undefined bit "X" bit may exhaust the ECC mechanism and lead to wrong data without being indicated.

In the following, an example for a Hamming Code with correction capability for 2 undefined bits is provided with k=8 bits of the data word, r=4 extra bits and n=12 bits stored (shortened Hamming Code). The data word is

D=(1 0 0 0 0 0 0 0)

and the extra bits amount to

R=D $\underline{A}^T$=(1 1 0 0).

The generator matrix $\underline{A}$ and the parity check matrix $\underline{H}$ of the Hamming Code may be defined as follows:

$$A = \begin{bmatrix} 1 & 1 & 1 & 0 & 0 & 0 & 1 & 1 \\ 1 & 0 & 0 & 1 & 1 & 0 & 1 & 0 \\ 0 & 1 & 0 & 1 & 0 & 1 & 1 & 1 \\ 0 & 0 & 1 & 0 & 1 & 1 & 0 & 1 \end{bmatrix}$$

$$H = [A I] = \begin{bmatrix} 1 & 1 & 1 & 0 & 0 & 0 & 1 & 1 & 1 & 0 & 0 & 0 \\ 1 & 0 & 0 & 1 & 1 & 0 & 1 & 0 & 0 & 1 & 0 & 0 \\ 0 & 1 & 0 & 1 & 0 & 1 & 1 & 1 & 0 & 0 & 1 & 0 \\ 0 & 0 & 1 & 0 & 1 & 1 & 0 & 1 & 0 & 0 & 0 & 1 \end{bmatrix}$$

This may lead to the following cases:

(1) Case 1: The following information is read:
Y=(1 0 0 0 0 0 0 0 1 1 0 0)
The syndrome S results in:
$S=\underline{H}\,Y^T=(0\ 0\ 0\ 0)^T$
Hence, no correction is necessary.

(2) Case 2: The following information is read:
Y=(1 1 0 0 0 0 0 0 1 1 0 0)
wherein the second bit amounting to "1" indicates an error. The syndrome S is determined as follows
$S=\underline{H}\,Y^T=(1\ 0\ 1\ 0)^T$
thereby indicating the second column in matrix $\underline{H}$. Hence, the second bit is inverted from "1" to "0" to obtain a corrected data word D'.

(3) Case 3: The following information is read:
Y=(1 0 1 0 0 0 0 0 1 0 0 0)
wherein the third bit of the data word D being "1" indicates a first error and the second bit of the extra bits "0" indicates a second error. The syndrome S is determined as follows:
$S=\underline{H}\,Y^T=(1\ 1\ 0\ 1)^T$.
The vector $(1\ 1\ 0\ 1)^T$ does not correspond to any column of the matrix $\underline{H}$. Hence, the error(s) cannot be recovered, but it can be detected.

(4) Case 4a: The following information is read:
Y=(1 X 0 0 0 0 0 0 1 1 0 0)→f=1
indicating an undefined bit "X" at the position f=1 (the second position of the data word D). In case the bit 1 of Y (i.e. the second bit for which the undefined bit "X" was determined) is set to "0", a corrected data word D' can be obtained that results in the following syndrome S:
$S=\underline{H}\,Y^T|_{yf=0}=(0\ 0\ 0\ 0)^T$ (5) Case 4b: The following information is read:
Y=(X 0 0 0 0 0 0 0 1 1 0 0)→f=0
indicating an undefined bit "X" at the position f=0 (the first position of the data word D). Setting bit 0 of Y (i.e. the first bit for which the undefined bit "X" was determined) to "0" results in the following syndrome S
$S=\underline{H}\,Y^T|_{yf=0}=(1\ 1\ 0\ 0)^T$,
which indicates an error at the position of the data word identified by the vector $(1\ 1\ 0\ 0)^T$, i.e. the first column corresponding to the first position of the data word. In other words, the vector $(1\ 1\ 0\ 0)^T$ also identifies the column f=0 of the matrix $\underline{H}$. Hence, bit 0 of Y is to be set to "1" to obtain the corrected data word D'.

(6) Case 5a: The following information is read:
Y=(1 X X 0 0 0 0 0 1 1 0 0)→f1=1, f2=2
indicating undefined bits "X" at the positions f1=1 and f2=2 (second and third position of the data word D).
Both bits (bit 1 and bit 2) are set to "0" and the syndrome S is determined as follows:
$S=\underline{H}\,Y^T|_{yf1=yf2=0}=(0\ 0\ 0\ 0)^T$.
Hence, bit 1 and bit 2 were correctly set to "0" in order to obtain the corrected data word D'.

(7) Case 5b: The following information is read:
Y=(X 0 0 X 0 0 0 0 1 1 0 0)→f1=0, f2=3
indicating undefined bits "X" at the positions f1=0 and f2=3 (first and fourth position of the data word D). Both bits (bit 0 and bit 3) are set to "0" and the syndrome S is determined as follows:

$S = \underline{H} Y^T|_{yf1=yf2=0} = (1\ 1\ 0\ 0)^T$.

The syndrome S also identifies the first column (i.e. column f1=0) of the matrix $\underline{H}$. Hence, the bit 3 remains "0" and the bit 0 is set to "1" to obtain a corrected data word D'.

(8) Case 5c: The following information is read:
$Y = (X\ 0\ 0\ 0\ 0\ 0\ 0\ 1\ X\ 0\ 0) \rightarrow f1=0, f2=9$
indicating undefined bits "X" at the positions f1=0 and f2=9. Both bits (bit 0 and bit 9) are set to "0" and the syndrome S is determined as follows:
$S = \underline{H} Y^T|_{yf1=yf2=0} = (1\ 0\ 0\ 0)^T = (1\ 1\ 0\ 0)^T + (0\ 1\ 0\ 0)^T$.

The syndrome S also identifies columns f1=0 and f2=9 of the matrix $\underline{H}$. Hence, the bit 0 is set to "1" and the bit 9 is set to "1" to obtain a corrected data word D'.

(9) Case 6: The following information is read:
$Y = (X\ 0\ 0\ 0\ 0\ 0\ 1\ 1\ X\ 0\ 0) \rightarrow f1=0, f2=9$
indicating undefined bits "X" at the positions f1=0 and f2=9 in addition to an error at bit 7.

Both undefined bits (bit 0 and bit 9) are set to "0" and the syndrome S is determined as follows:
$S = \underline{H} Y^T|_{yf1=yf2=0} = (0\ 0\ 1\ 1)^T \neq (1\ 1\ 0\ 0)^T$ and $\neq (0\ 1\ 0\ 0)^T$ and $\neq (1\ 1\ 0\ 0)^T + (0\ 1\ 0\ 0)^T$ The result does not identify any combination of the columns 0 and 9 of the matrix $\underline{H}$. Hence, an error may be detected, but the error is not recoverable.

(10) Case 7: The following information is read:
$Y = (X\ 0\ 0\ 0\ 0\ 0\ 0\ X\ 1\ X\ 0\ 0)$
indicating undefined bits "X" at the positions f1=0 and f2=7 and f3=9. This leads to an unrecoverable error.

Extended Hamming Code With Correction Capability for 3 Undefined Bits

For details regarding the extended Hamming Code, reference is made, e.g., to http://en.wikipedia.org/wiki/Hamming_code#Hamming_codes_with_additional_parity_.28SECDED.29.

In this example scenario, a systematic extended Hamming Code is used with
- a generator matrix $\underline{A}$ of the extended Hamming Code including an additional parity row compared to the generator matrix of the Hamming Code described above;
- a parity check matrix $\underline{H}$ of the extended Hamming Code, wherein $\underline{H} = [\underline{A}\ \underline{I}]$ with I being the identity matrix.

When writing a k-bits data word $D = (d_0 \ldots d_{k-1})$ into the memory, r extra bits $R = (r_0 \ldots r_{r-1})$ are written. Overall, n=k+r bits are stored.

The r extra bits correspond to the condition
$R \geq \lceil ln(n) \rceil + 1 = \lceil ln(k+r) \rceil + 1$ Typically, the following applies:
$r = \lceil ln(n) \rceil + 1 = \lceil ln(k+r) \rceil + 1$ In addition, the following definition may apply:
$R = D\ \underline{A}^T$.

When reading a data word D from the memory, all n bits of
$Y = (d_0 \ldots d_{k-1}, r_0 \ldots r_{r-1})$
are read, each resulting in a value out of ["0", "1", "X"].

If all n bits of Y have values out of ["0", "1"] the following applies:
if a syndrome
$S = \underline{H} Y^T == 0$,
then data $D = (d_0 \ldots d_{k-1})$ is assumed to be correct.
  else: if the syndrome $S \neq 0$ is equal to a column i of $\underline{H}$, then a single flipped bit is assumed and corrected by inverting bit i of Y.
  else: the syndrome $S \neq 0$ is not equal to any column of $\underline{H}$, an unrecoverable data error may be indicated.

If n−1 bits of Y have values out of ["0", "1"] and one bit $y_f$ (at position f) is "X", the following applies:
if the syndrome
$S = \underline{H} Y^T|_{yf=0} == 0$,
then $y_f' = 0$ is set,
  else: if the syndrome $S \neq 0$ is equal to column f of $\underline{H}$, then $y_f' = 1$ is set,
  else: if the syndrome $S \neq 0$ is equal to column i of $\underline{H}$, then $y_f' = 0$ and bit i of Y is inverted,
  else: if the syndrome $S \neq 0$ is equal to the modulo-2 sum of the column f and column i of $\underline{H}$, then $y_f' = 1$ is set and bit i of Y is inverted,
  else an unrecoverable data error may be indicated.
  corrected data D'=first k bits of $Y' = (y_0 \ldots y_f' \ldots y_{n-1})$ with potentially bit i inverted as indicated above is assumed to be correct.

If n−2 bits out of Y have values out of ["0", "1"] and two bits $y_{f1}$ and $y_{f2}$ (at positions f1 and f2, respectively) are "X", the following applies:
if the syndrome
$S = \underline{H} Y^T|_{yf1=yf2=0} == 0$,
then $y_{f1}' = y_{f2}' = 0$ are set,
  else: if the syndrome $S \neq 0$ is equal to column f1 of $\underline{H}$, then $y_{f1}' = 1$ and $y_{f2}' = 0$ are set,
  else: if the syndrome $S \neq 0$ is equal to column f2 of $\underline{H}$, then $y_{f1}' = 0$ and $y_{f2}' = 1$ are set,
  else: if the syndrome $S \neq 0$ is equal to the modulo-2 sum of columns f1 and f2 of $\underline{H}$, then $y_{f1}' = y_{f2}' = 1$ are set,
  else an unrecoverable data error may be indicated.
  corrected data D'=first k bits of $Y' = (y_0 \ldots y_{f1}' \ldots y_{f2}' \ldots y_{n-1})$ is assumed to be correct.

If n−3 bits out of Y have values out of ['0', '1'] and three bits $y_{f1}$, $y_{f2}$, and $y_{f3}$ (at positions f1, f2, and f3, respectively) are 'X', then
if the syndrome
$S = \underline{H} Y^T|_{yf1=yf2=yf3=0} == 0$,
then $y_{f1}' = y_{f2}' = y_{f3}' = 0$ are set,
  else: if the syndrome $S \neq 0$ is equal to one of the columns fa (a=1, 2, 3) of $\underline{H}$, then $y_{fa}' = 1$ and the two other $y_{f(\neq a)}' = 0$ are set,
  else: if the syndrome $S \neq 0$ is equal to the modulo-2 sum of two of the columns fa and fb of $\underline{H}$, then $y_{fa}' = y_{fb}' = 1$ and the other $y_{f(\neq a, \neq b)}' = 0$ are set,
  else: if the syndrome $S \neq 0$ is equal to the modulo-2 sum of all three columns f1, f2, and f3 of $\underline{H}$, then $y_{f1}' = y_{f2}' = y_{f3}' = 1$ are set,
  else an unrecoverable data error may be indicated.
  corrected data D'=first k bits of $Y' = (y_0 \ldots y_{f1}' \ldots y_{f2}' \ldots y_{n-1})$ is assumed to be correct.

If more than 3 bits out of Y are undefined bits "X", an unrecoverable data error may be indicated.

A read data word with more than two flipped bits out of ["0", "1"] may exhaust the ECC mechanism and lead to wrong data without being indicated. A read data word with two flipped bits out of ["0", "1"] and one or two undefined bit(s) "X" bit may exhaust the ECC mechanism and lead to wrong data without being indicated. A read data word with one flipped bit out of ["0", "1"] and three undefined bits "X" may exhaust the ECC mechanism and lead to wrong data without being indicated.

In the following, an example for an extended Hamming Code with correction capability for 3 undefined bits is provided with k=8 bits of the data word, r=5 extra bits and n=13 bits stored (shortened Hamming Code). The data word is
$D = (1\ 0\ 0\ 0\ 0\ 0\ 0\ 0)$
and the extra bits amount to
$R = D\ \underline{A}^T = (1\ 1\ 0\ 0\ 1)$ The generator matrix $\underline{A}$ and the parity check matrix $\underline{H}$ of the extended Hamming Code may be defined as follows:

$$\underline{A} = \begin{bmatrix} 1 & 1 & 1 & 0 & 0 & 0 & 1 & 1 \\ 1 & 0 & 0 & 1 & 1 & 0 & 1 & 0 \\ 0 & 1 & 0 & 1 & 0 & 1 & 1 & 1 \\ 0 & 0 & 1 & 0 & 1 & 1 & 0 & 1 \\ 1 & 1 & 1 & 1 & 1 & 1 & 0 & 0 \end{bmatrix}$$

$$\underline{H} = [\underline{A}I] = \begin{bmatrix} 1 & 1 & 1 & 0 & 0 & 0 & 1 & 1 & 1 & 0 & 0 & 0 & 0 \\ 1 & 0 & 0 & 1 & 1 & 0 & 1 & 0 & 0 & 1 & 0 & 0 & 0 \\ 0 & 1 & 0 & 1 & 0 & 1 & 1 & 1 & 0 & 0 & 1 & 0 & 0 \\ 0 & 0 & 1 & 0 & 1 & 1 & 0 & 1 & 0 & 0 & 0 & 1 & 0 \\ 1 & 1 & 1 & 1 & 1 & 0 & 0 & 0 & 0 & 0 & 0 & 0 & 1 \end{bmatrix}$$

This may lead to the following cases:

(1) Case 1: The following information is read:
Y=(1 0 0 0 0 0 0 0 1 1 0 0 1)
The syndrome S results in:
$S = \underline{H} Y^T = (0\ 0\ 0\ 0\ 0)^T$
Hence, no correction is necessary.

(2) Case 2: The following information is read:
Y=(1 1 0 0 0 0 0 0 1 1 0 0 1)
wherein the second bit (bit 1) is "1", which is an error. The syndrome S is determined as follows
$S = \underline{H} Y^T = (1\ 0\ 1\ 0\ 1)^T$,
wherein the vector $(1\ 0\ 1\ 0\ 1)^T$ refers to column 1 (the second column) of the matrix $\underline{H}$. Hence, bit 1 of Y is inverted from "1" to "0" to obtain a corrected data word D'.

(3) Case 3: The following information is read:
Y=(1 0 1 0 0 0 0 0 1 0 0 0 1)
with an error in bit 2 ("1" instead of "0") and another error in bit 9 ("0" instead of "1"). The syndrome S results in
$S = \underline{H} Y^T = (1\ 1\ 0\ 1\ 1)^T$,
which does not correspond to any column of the matrix $\underline{H}$. Hence, the error(s) are detected but cannot be recovered.

(4) Case 4a: The following information is read:
Y=(1 X 0 0 0 0 0 0 1 1 0 0 1)→f=1
indicating an undefined bit "X" at the position f=1 (the second position of the data word D). This bit 1 at the position f=1 is set to "0" and the syndrome S is determined as
$S = \underline{H} Y^T|_{yf=0} = (0\ 0\ 0\ 0\ 0)^T$,
indicating that "0" is the correct value for bit 1 in order to obtain the corrected data word D'.

(5) Case 4b: The following information is read:
Y=(X 0 0 0 0 0 0 0 1 1 0 0 1)→f=0
indicating an undefined bit "X" at the position f=0 (the first position of the data word D). This bit 0 at the position f=0 is set to "0" and the syndrome S is determined as
$S = \underline{H} Y^T|_{yf=0} = (1\ 1\ 0\ 0\ 1)^T$,
which also indicates an error in column 0 of the matrix $\underline{H}$. Hence, bit 0 of Y has to be set to "1" to obtain a corrected data word D'.

(6) Case 5a: The following information is read:
Y=(1 X X 0 0 0 0 0 1 1 0 0 1)→f1=1, f2=2
indicating undefined bits "X" at the positions f1=1 and f2=2 (second and third position of the data word D). These bits (bit 2 and bit 3) are set to "0" and the syndrome S is determined as
$S = \underline{H} Y^T|_{yf1=yf2=0} = (0\ 0\ 0\ 0\ 0)^T$,
indicating that "0" is the correct value for bit 1 and bit 2 in order to obtain the corrected data word D'.

(7) Case 5b: The following information is read:
Y=(X 0 0 X 0 0 0 0 1 1 0 0 1)→f1=0, f2=3
indicating undefined bits "X" at the positions f1=0 and f2=3 (first and fourth position of the data word D). Both bits (bit 0 and bit 3) are set to "0" and the syndrome S is determined as follows:
$S = \underline{H} Y^T|_{yf1=yf1=0} = (1\ 1\ 0\ 0\ 1)^T$.
The syndrome S also identifies the first column (i.e. column f1=0) of the matrix $\underline{H}$. Hence, bit 3 remains "0" and bit 0 is set to "1" to obtain the corrected data word D'.

(8) Case 5c: The following information is read:
Y=(X 0 0 0 0 0 0 0 1 X 0 0 1)→f1=0, f2=9
indicating undefined bits "X" at the positions f1=0 and f2=9. Both bits (bit 0 and bit 9) are set to "0" and the syndrome S is determined as follows:
$S = \underline{H} Y^T|_{yf1=yf2=0} = (1\ 0\ 0\ 0\ 1)^T = (1\ 1\ 0\ 0\ 1)^T + (0\ 1\ 0\ 0\ 0)^T$.
The syndrome S also identifies columns 0 and 9 of the matrix $\underline{H}$. Hence, the bit 0 is set to "1" and the bit 9 is set to "1" to obtain a corrected data word D'.

(9) Case 6a: The following information is read:
Y=(1 X 0 0 0 0 1 1 1 1 0 0 1)→f=1
indicating an undefined bit "X" at the position f=1 and an error at bit 7. The bit at the position f=1 is set to "0" and the syndrome S is determined as
$S = \underline{H} Y^T|_{yf=0} = (1\ 0\ 1\ 1\ 0)^T$,
wherein the vector $(1\ 0\ 1\ 1\ 0)^T$ refers to column 7 of the matrix $\underline{H}$. Hence, bit 7 of Y is inverted from "1" to "0" and bit 1 was correctly set to "0" to obtain a corrected data word D'.

(10) Case 6b: The following information is read:
Y=(0 0 0 0 0 0 0 1 X 0 0 1)→f=9
indicating an undefined bit "X" at the position f=9 and an error at bit 0. The bit at the position f=9 is set to "0" and the syndrome S is determined as
$S = \underline{H} Y^T|_{yf=0} = (1\ 0\ 0\ 0\ 1)^T = (1\ 1\ 0\ 0\ 1)^T + (0\ 1\ 0\ 0\ 0)^T$.
The syndrome S also identifies column 9 and additionally column 0 of the matrix $\underline{H}$. Hence, the bit 0 is inverted to "1" and the bit 9 is set to "1" to obtain a corrected data word D'.

(11) Case 7: The following information is read:
Y=(0 0 0 0 0 0 0 0 X X 0 0 1)→f1=8, f2=9
indicating two undefined bits "X" at the positions f1=8 and f2=9. In addition, an error occurred at bit 0. Both bits at the positions f1=8 and f2=9 are set to "0" and the syndrome S is determined as
$S = \underline{H} Y^T|_{yf=0} = (0\ 0\ 0\ 0\ 1)^T \neq (0\ 0\ 0\ 0\ 0)^T$ and $\neq (1\ 0\ 0\ 0\ 0)^T$ and $\neq (0\ 1\ 0\ 0\ 0)^T$ and $\neq (1\ 0\ 0\ 0\ 0)^T + (0\ 1\ 0\ 0\ 0)^T$
The result does not identify any combination of columns 8 and 9 of the matrix $\underline{H}$. Hence, the error is not recoverable.

(12) Case 8a: The following information is read:
Y=(1 X X X 0 0 0 0 1 1 0 0 1)→f1=1, f2=2, f3=3
indicating three undefined bits "X" at the positions f1=1 and f2=2 and f3=3. The bits at these positions are set to "0" and the syndrome S is determined as
$S = \underline{H} Y^T|_{yf1=yf2=yf3=0} = (0\ 0\ 0\ 0\ 0)^T$
indicating that "0" is the correct value for bit 1, bit 2 and bit 3 of Y in order to obtain the corrected data word D'.

(13) Case 8b: The following information is read:
Y=(X 0 X X 0 0 0 0 1 1 0 0 1)→f1=0, f2=2, f3=3
indicating three undefined bits "X" at the positions f1=0 and f2=2 and f3=3. The bits at these positions are set to "0" and the syndrome S is determined as
$S = \underline{H} Y^T|_{yf1=yf2=yf3=0} = (1\ 1\ 0\ 0\ 1)^T$,
wherein the vector $(1\ 1\ 0\ 0\ 1)^T$ also refers to column 0 of the matrix $\underline{H}$. Hence, bit 0 of Y is set to "1" and bit 2 and bit 3 were correctly set to "0" to obtain a corrected data word D'.

(14) Case 8c: The following information is read:
Y=(X 0 X 0 0 0 0 0 X 1 0 0 1)→f1=0, f2=2, f3=8
indicating three undefined bits "X" at the positions f1=0 and f2=2 and f3=8. The bits at these positions are set to "0" and the syndrome S is determined as
$S=\underline{H} Y^T|_{yf1=yf2=yf3=0}=(0\ 1\ 0\ 0\ 1)^T=(1\ 1\ 0\ 0\ 1)^T+(1\ 0\ 0\ 0\ 0)^T$.
The syndrome S also identifies columns 0 and 8 of the matrix $\underline{H}$. Hence, bit 0 and bit 8 are set to "1" and bit 2 is set to "0" to obtain a corrected data word D'.

(15) Case 8d: The following information is read:
Y=(X 0 0 0 0 0 0 0 X X 0 0 1)→f1=0, f2=8, f3=9
indicating three undefined bits "X" at the positions f1=0 and f2=8 and f3=9. The bits at these positions are set to "0" and the syndrome S is determined as
$S=\underline{H} Y^T|_{yf1=yf2=yf3=0}=(0\ 0\ 0\ 0\ 1)^T=(1\ 1\ 0\ 0\ 1)^T+(1\ 0\ 0\ 0\ 0)^T+(0\ 1\ 0\ 0\ 0)^T$=column f1 of $\underline{H}$+column f2 of $\underline{H}$+column f3 of $\underline{H}$→set bits 0, 8, and 9 of Y to '1'
The syndrome S also identifies columns 0, 8 and 9 of the matrix $\underline{H}$. Hence, bit 0, bit 8 and bit 9 are set to "1" to obtain a corrected data word D'.

(16) Case 9: The following information is read:
Y=(X 0 0 0 X 0 0 X 1 X 0 0 0)
indicating four undefined bits "X" at the positions f1=0 and f2=4 and f3=7 and f3=9. This leads to an unrecoverable error.

Figure 2:
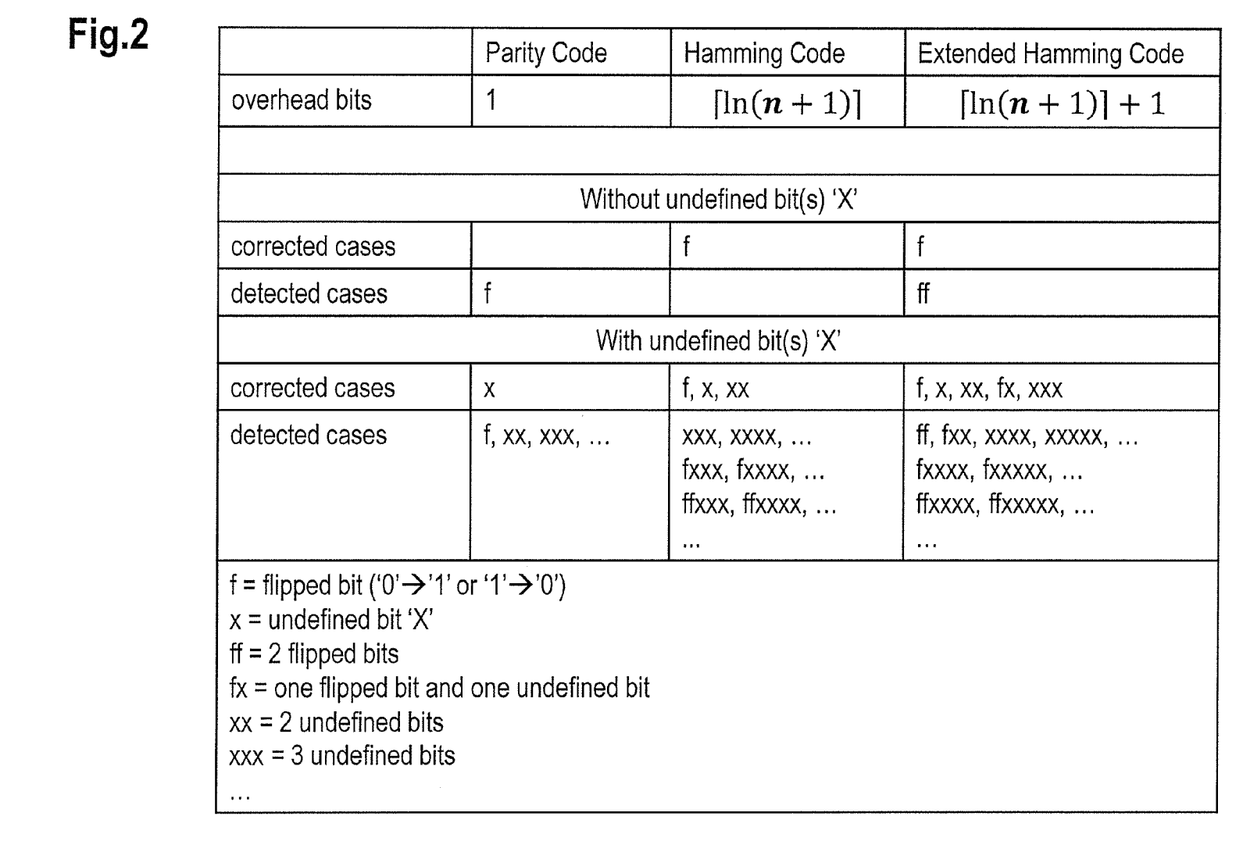
FIG. 2 shows a summarizing table of codes and properties.

FIG. 2 shows a summarizing table of codes and properties:
(a) In case of the parity code, the overhead amounts to a single overhead bit.
The parity code without any undefined bit "X" allows detection of a single flipped bit "f" (flipped from "0" to "1" or vice versa).
In the parity code example with at least one undefined bit "X" the following applies: A single undefined bit "X" can be (detected and) corrected. In additional cases, a single flipped bit can be detected.
(b) In case of the Hamming Code, the number of overhead bits amount to $\lceil\ln(n+1)\rceil$ (with n being the number of bits stored).
The Hamming Code without any undefined bit "X" allows (detection and) correction of a single flipped bit "f".
In the Hamming Code example with at least one undefined bit "X" the following applies: A single flipped bit "f" or a single undefined bit "X" or two undefined bits "X" can be (detected and) corrected. In additional cases, it is possible to detect three or more undefined bits "X" together with any additional number of flipped bits "f".
(c) In case of the extended Hamming Code, the number of overhead bits amount to $\lceil\ln(n+1)\rceil+1$ (with n being the number of bits stored).
The extended Hamming Code (without any undefined bit "X") allows (detection and) correction of a single flipped bit "f" and detection of two flipped bits "f".
In the Hamming Code example with at least one undefined bit "X" the following cases can be (detected and) corrected: A single flipped bit "f", a single undefined bit "X", two undefined bits "X", a single flipped bit "f" together with one undefined bit "X" and three undefined bits "X". In additional cases, it is possible to detect two flipped bits "f", one flipped bit "f" together with two undefined bits "X", at least four undefined bits "X" together with any number of additional flipped bits "f".

Figure 3:
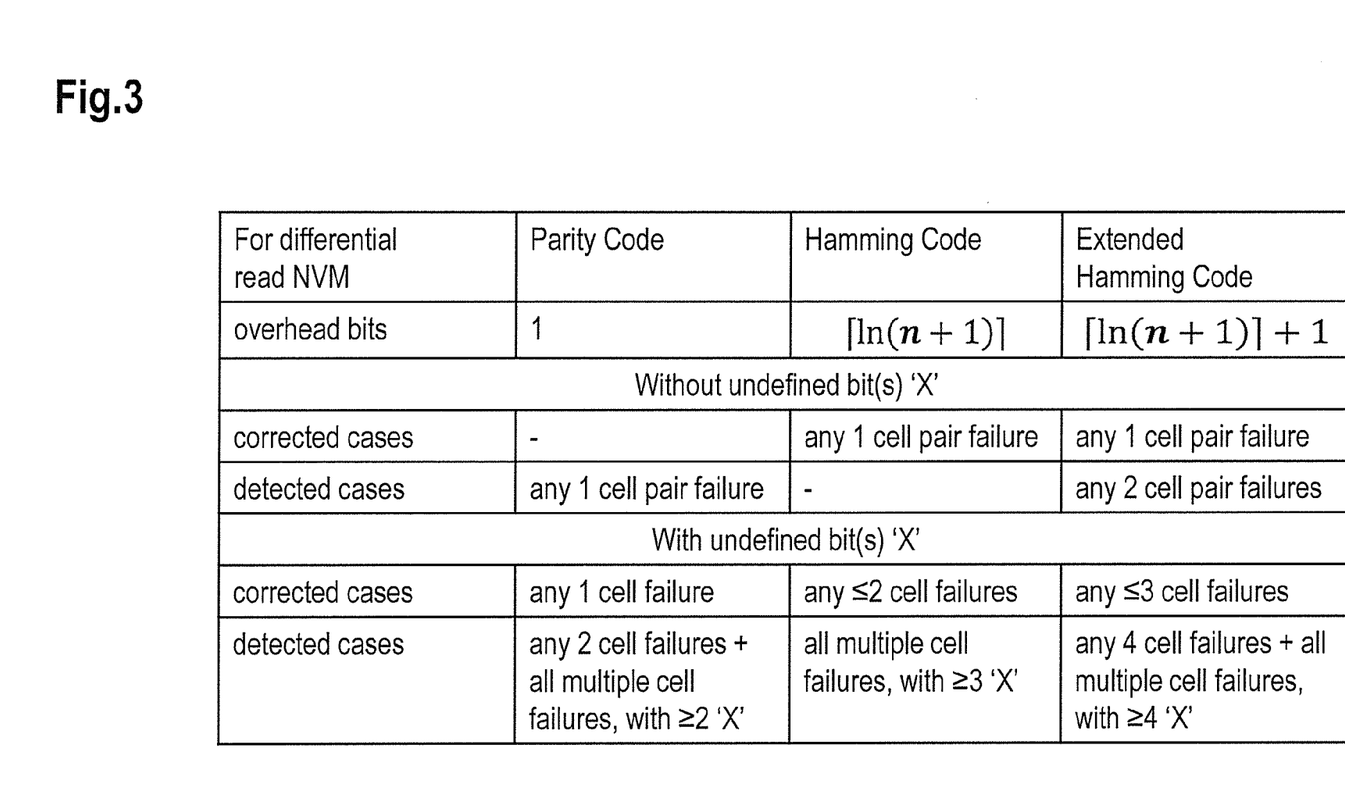
FIG. 3 shows a table comprising the same codes as shown in FIG. 2, applicable for pairs of cells of a differential read non-volatile memory (NVM).

FIG. 3 shows a table comprising the same codes as shown in FIG. 2, wherein the scenario is utilized in particular in case of non-volatile memories (NVMs) with differential read, wherein each cell is part of a pair of two cells (cell pair, differential cells) and wherein "X" indicates an undefined state of the cell pair:

(a) In case of the parity code, the overhead amounts to a single overhead bit.
The parity code without any undefined bit "X" allows detection of any single cell pair failure.
In the parity code example with at least one undefined bit "X" the following applies:
Any 1 cell failure can be (detected and) corrected. If only one cell of a cell pair shows a failure and the other one of the cell pair has the correct value, this corresponds to a state "X" of the pair of cells or to an undefined bit "X" represented by this particular pair of cells. Based on the value of the parity bit, it can be determined whether "X" should read "0" or "1". Hence, it can be determined, which of the cells of the pair of cells has the incorrect state.
In addition, any 2 cell failures and all multiple cell failures with at least two undefined bits "X" can be detected: The 2 cell failures comprise the case when two cells of a pair both show the wrong state, which indicates a flipped bit represented by this pair of cells. Such single flipped bit can be detected based on the parity bit.
Also, two or more undefined bits "X" can be detected, wherein each undefined bit "X" is based on a pair of cells, wherein one of the cells of this pair has the wrong state. This can be detected by the functionality that allows detection of the "X" state for a bit represented by two cells of a differential memory.
(b) In case of the Hamming Code, the number of overhead bits amount to $\lceil\ln(n+1)\rceil$ (with n being the number of bits stored).
The Hamming Code without any undefined bit "X" allows (detection and) correction of any 1 cell pair failure.
In the Hamming Code example with at least one undefined bit "X" the following applies:
Any 1 cell failure and any 2 cell failure can be detected and corrected. The 2 cell failure may be a failure in both cells of a cell pair (leading to a flipped bit). The 2 cell failure may also be a failure in two cells of different cell pairs leading to two undefined bits "X". Both can be corrected by the Hamming Code.
In addition, all multiple cell failures with at least three undefined bits "X" can be detected.
Also, more than three undefined bits "X" can be detected.
(c) In case of the extended Hamming Code, the number of overhead bits amount to $\lceil\ln(n+1)\rceil+1$ (with n being the number of bits stored).
The extended Hamming Code (without any undefined bit "X") allows (detection and) correction of any 1 cell pair failure and detection of any 2 cell pair failures.
In the extended Hamming Code example with at least one undefined bit "X" the following applies:
Any 1 cell failure, any 2 cell failure and any 3 cell failure can be detected and corrected.
In addition, any 4 cell failures and all multiple cell failures with at least four undefined bits "X" can be detected. The 4 cell failures may be any combination of 4 erroneous single cells distributed among 2, 3 or 4 pairs of cells leading to any of the following: two flipped bits, one flipped bit in combination with two undefined bits or four undefined bits.
Also, more than four undefined bits "X" can be detected.
Hence, using the extended Hamming Code, all cell failures of 1 cell, 2 cells or 3 cells can be corrected with a 1-bit correction/2-bit detection code, which corresponds to a low number of overhead bits.

Probabilities of Different States

As an option, probabilities for the occurrence of different bits in differential read NVMs can be taken into account. For example, a probability P("X") for an undefined bit "X" and a probability P("f") for a flipped bit "f" may be substantially different, because the undefined bit "X" requires only one cell of a cell pair to fail, whereas the flipped bit "f" requires both cells of the same cell pair to fail into opposite directions. Hence the probability for the flipped bit may be less than the probability $P(2X_W)$ for two undefined bits in a read data word, i.e.

$P("f") \ll P(2X_W)$,

In addition, the probabilities for erroneous cells may be different due to unlike underlying physical mechanisms. Hence, a probability $P(1 \to 0)$ for a change from "1" to "0" may be different from a probability $P(0 \to 1)$ for a change from "0" to "1". This effect further reduces the probability P("f") in view of the probability $P(2X_W)$.

In case of an extreme asymmetry, i.e. in case of $P(0 \to 1) = 0$ or $P(1 \to 0) = 0$ the probability P("f") results to 0. Hence, no flipped bit, but only an undefined state "X" is possible. This allows at least for detection (and possible correction) of all cell failures, i.e. no undetected cell failures exist, since no combination and number of "X" in a data word can remain undetected.

Further Advantages and Examples

The solution presented can be applied to NVMs with differential read, in particular to NVM cell types like Floating Gate, phase-change random access memory (PCRAM), resistive random access memory (RRAM), magneto-resistive random access memory (MRAM), metal-oxide-nitride-oxide-silicon (MONOS) devices, nanocrystal cells, etc. The solution can be used for all memory types, in particular RAMs and read only memories (ROMs).

The solution can be implemented in various kinds of applications, e.g., directed to data transmission, data storage, in particular on memory devices like, e.g., hard discs.

The solution can also be combined with various types of error detection and/or error correction schemes, e.g., block codes, cyclic codes, BCH-codes, etc.

The examples suggested herein may in particular be based on at least one of the following solutions. In particular combinations of the following features could be utilized in order to reach a desired result. The features of the method could be combined with any feature(s) of the device or system or vice versa.

A method is provided for data processing comprising reading data, the data comprising overhead information and payload information, and determining a state of each portion of the data, wherein the state comprises at least one of a first binary state, a second binary state, and an undefined state. The method further comprises decoding at least one portion of data that has an undefined state based on its location and based on the overhead information.

It is noted that data processing may in particular comprise error detection and/or error correction. In particular, decoding comprises error detection and/or error correction. In this regard, error correction may comprise error detection. The undefined state "X" can be determined, which also reveals an additional information, where (i.e. the location) the undefined state occurred, i.e. which bit or memory cell shows such undefined state "X". Decoding in particular comprises determining the correct value for a portion of data, e.g., bit or cell that is associated with this undefined state "X".

Hence, "location" in this sense allows determining which portion of the information shows the undefined state. This additional information can be utilized in existing error correction codes to derive a correct value for at least one such undefined portion of data and/or to detect additional errors which would otherwise remain hidden.

According to an embodiment, decoding at least one portion of data comprises determining the payload information.

According to an embodiment, decoding at least one portion of data comprises error detection based on an error correction code.

According to an embodiment, the error correction code is one of the following: a parity code, a Hamming code, an extended Hamming code, a cyclic code, and a block code.

According to an embodiment, each portion of the data is a bit and the overhead information comprises at least one bit.

According to an embodiment, the portion of the data corresponds to a memory cell.

According to an embodiment, the memory cell is a memory cell of a non-volatile memory.

According to an embodiment, the memory cell is part of two memory cells which are used in a differential read memory.

The differential read memory comprises several pairs of cells, each pair comprising cells with opposite values. If the memory cells of a pair do not show opposite values, this may indicate an undefined state "X".

According to an embodiment, the undefined state of a memory cell is determined by a pair of memory cells of the differential read memory showing the same logical state.

According to an embodiment, the method comprises decoding at least one portion of data based on different probabilities for the occurrence of different bits in the differential read memory.

For example, based on physical effects, e.g., of a NVM device with the differential read feature, the probabilities for an undefined state "X" may be substantially higher compared to a flipped cell pair (both cells of the cell pair flipped thereby indicating the wrong value of the bit represented by this pair of cells). Such asymmetric probability distribution can be considered by error correction mechanisms. For example, if an unwanted change of a cell, e.g., from "1" to "0" or vice versa, can be avoided, the probability for a flipped cell representing the wrong value will amount to 0.

According to an embodiment, the differential read memory comprises at least one of the following: floating gate cells, PCRAM, RRAM, MRAM, MONOS devices, nanocrystal cells, RAM, and ROM.

According to an embodiment, decoding comprises detection of an error based on the overhead information and based on the undefined stated of at least one portion of the data.

According to an embodiment, the method comprises correcting an error based on the overhead information and based on the position of the portion of data that shows an undefined state.

According to an embodiment, the method comprises reading data Y having n bits, k bits of payload information D and one bit of overhead information $r_0$, and determining a state of each bit of the data Y. If all n bits of Y have values out of ["0", "1"] then the following applies:

if $r_0$=Parity(D), then the payload information D=($d_0 \ldots d_{k-1}$) is assumed to be correct;

if k−1 bits out of the bits $d_0 \ldots d_{k-1}$ of the payload information plus the overhead information $r_0$ have values from ["0", "1"] and if one bit $d_f$ has an undefined state "X", then $d_f'$=Parity($d_0 \ldots d_{k-1}, r_0$)$|_{df=0}$ is set and a corrected payload information is determines as D'=($d_0 \ldots d_f' \ldots d_{k-1}$); and if all bits of $d_0 \ldots d_{k-1}$ of the payload information have values from ["0", "1"] and $r_0$ has an undefined state "X", then the payload information $D=(d_0 \ldots d_{k-1})$ is assumed to be correct.

It is noted that a bit may correspond to a single cell value of a memory, in particular a NVM, wherein each cell is part of a pair of cells of a differential read memory. Hence, an undefined state of a cell corresponds to two cells of such pair of cells showing the same logical state. Hence, the information "undefined state X" can be derived from the pair of cells which should in normal cases indicate opposite states.

According to an embodiment, based on a Hamming code with a generator matrix $\underline{A}$ of the Hamming Code, a parity check matrix $\underline{H}$ of the Hamming Code, wherein $\underline{H}=[\underline{A}\ \underline{I}]$, with $\underline{I}$ being the identity matrix, the method comprises reading data Y having n bits, k bits of payload information D and r bits of overhead information $R=(r_0 \ldots r_{r-1})$, and determining a state of each bit of the data Y. If all n bits of Y have values out of ["0", "1"] the followings applies:

if a syndrome S fulfills the condition
$S=\underline{H}\,Y^T==0$,
then the payload information $D=(d_0 \ldots d_{k-1})$ is assumed to be correct;
  else: if the syndrome S≠0 is equal to a column i of $\underline{H}$, then a single flipped bit is assumed and corrected by inverting bit i of Y;
  else: as an option, if the syndrome S≠0 is not equal to any column of $\underline{H}$, an unrecoverable data error is determined;
if n−1 bits of Y have values out of ["0", "1"] and one bit $y_f$ has the undefined state "X", the following applies:
if a syndrome S fulfills the condition
$S=\underline{H}\,Y^T|_{yf=sv}==0$, with sv=["0", "1"]
then $y_f'=sv$ is set;
  else: if the syndrome S≠0 is equal to a column f of $\underline{H}$, then $y_f'=1-sv$ is set;
  else: as an option, an unrecoverable data error is determined;
if n−2 bits of Y have values out of ["0", "1"] and two bits $y_{f1}$ and $y_{f2}$ are undefined bits "X", the following applies:
if a syndrome S fulfills the condition
$S=\underline{H}\,Y^T|_{yf1=sv1;yf2=sv2}==0$, with sv1 and sv2=["0", "1"]
then $y_{f1}'=sv1$ and $y_{f2}'=sv2$ are set;
  else: if the syndrome S≠0 is equal to column f1 of $\underline{H}$, then $y_{f1}'=1-sv1$ and $y_{f2}'=sv2$ are set;
  else: if the syndrome S≠0 is equal to column f2 of $\underline{H}$, then $y_{f1}'=sv1$ and $y_{f2}'=1-sv2$ are set;
  else: if the syndrome S≠0 is equal to a modulo-2 sum of the columns f1 and f2 of $\underline{H}$, then $y_{f1}'=1-sv1$ and $y_{f2}'=1-sv2$ are set;
  else: as an option, an unrecoverable data error is determined.

According to an embodiment, based on an extended Hamming Code with a generator matrix $\underline{A}$ of the extended Hamming Code and a parity check matrix $\underline{H}$ of the extended Hamming Code, wherein $\underline{H}=[\underline{A}\ \underline{I}]$, with $\underline{I}$ being the identity matrix, the method comprises reading data Y having n bits, k bits of payload information D and r bits of overhead information $R=(r_0 \ldots r_{r-1})$, and determining a state of each bit of the data Y. If all n bits of Y have values out of ["0", "1"] the following applies:

if a syndrome S fulfills the condition
$S=\underline{H}\,Y^T==0$,
then the payload information $D=(d_0 \ldots d_{k-1})$ is assumed to be correct;
  else: if the syndrome S≠0 is equal to a column i of $\underline{H}$, then a single flipped bit is assumed and corrected by inverting bit i of Y;
  else: as an option, if the syndrome S≠0 is not equal to any column of $\underline{H}$, an unrecoverable data error is determined;
if n−1 bits of Y have values out of ["0", "1"] and one bit $y_f$ has the undefined state "X", the following applies:
if the syndrome S fulfills the condition
$S=\underline{H}\,Y^T|_{yf=sv}==0$, with sv=["0", "1"]
then $y_f'=0$ is set;
  else: if the syndrome S≠0 is equal to a column f of $\underline{H}$, then $y_f'=1-sv$ is set;
  else: if the syndrome S≠0 is equal to a column i of $\underline{H}$, then $y_f'=sv$ and bit i of Y is inverted;
  else: if the syndrome S≠0 is equal to a modulo-2 sum of the column f and the column i of $\underline{H}$, then $y_f'=1-sv$ is set and bit i of Y is inverted;
  else: as an option, an unrecoverable data error is determined;
if n−2 bits of Y have values out of ["0", "1"] and two bits $y_{f1}$ and $y_{f2}$ are undefined bits "X", the following applies:
if the syndrome S fulfills the condition
$S=\underline{H}\,Y^T|_{yf1=sv1;yf2=sv2}==0$, with sv1 and sv2=["0", "1"]
then $y_{f1}'=sv1$ and $y_{f2}'=sv2$ are set;
  else: if the syndrome S≠0 is equal to column f1 of $\underline{H}$, then $y_{f1}'=1-sv1$ and $y_{f2}'=sv2$ are set;
  else: if the syndrome S≠0 is equal to column f2 of $\underline{H}$, then $y_{f1}'=sv1$ and $y_{f2}'=1-sv2$ are set;
  else: if the syndrome S≠0 is equal to a modulo-2 sum of columns f1 and f2 of $\underline{H}$, then $y_{f1}'=1-sv1$ and $y_{f2}'=1-sv2$ are set;
  else: as an option, an unrecoverable data error is determined;
if n−3 bits out of Y have values out of ['0', '1'] and three bits $y_{f1}$, $y_{f2}$, and $y_{f3}$ are 'X', then
if the syndrome S fulfills the condition
$S=\underline{H}\,Y^T|_{yf1=sv1;yf2=sv2;yf3=sv3}==0$,
with sv1, sv2, and sv3=["0", "1"],
wherein $sv_a$ is one out of $sv_i$, with $i=1 \ldots 3$,
i.e. one out of sv1, sv2 and sv3,
wherein $sv_b$ is one out of $sv_i$, but different from $sv_a$,
wherein $sv_{(\neq a)}$ refers to the other $sv_i$ with $i \neq a$,
wherein $sv_{(\neq a \neq b)}$ refers to the other $sv_i$ with $i \neq a$ and $i \neq b$,
then $y_{f1}'=sv1$ and $y_{f2}'=sv2$ and $y_{f3}'=sv3$ are set;
  else: if the syndrome S≠0 is equal to one of the columns fa (a=1, 2, 3) of $\underline{H}$, then $y_{fa}'=1-sv_a$ and the two other $y_{f(\neq a)}'=sv_{(\neq a)}$ are set;
  else: if the syndrome S≠0 is equal to a modulo-2 sum of two of the columns fa and fb of $\underline{H}$, then $y_{fa}'=1-sv_a$ and $y_{fb}'=1-sv_b$ and the other $y_{f(\neq a, \neq b)}'=sv_{(\neq a \neq b)}$ are set;
  else: if the syndrome S≠0 is equal to a modulo-2 sum of all three columns f1, f2, and f3 of $\underline{H}$, then $y_{f1}'=1-sv1$ and $y_{f2}'=1-sv2$ and $y_{f3}'=1-sv3$ are set;
  else: as an option, an unrecoverable data error is determined.

According to an embodiment, the at least one portion of data corresponds to a signal conveyed via a bus line.

According to an embodiment, the bus line is part of two bus lines of a bus system, which utilizes the two bus lines as differential bus lines.

The bus system may support a differential bus read mode utilizing in particular several pairs of bus lines, each pair carrying signals with opposite values. If the signals of a pair do not show opposite values, this may correspond to the undefined state "X".

According to an embodiment, the undefined state corresponds to a pair of bus lines showing the same or substantially the same logical signal value.

An apparatus is provided for data processing comprising a processing unit configured to read data, the data comprising overhead information and payload information, and determine a state of each portion of the data, wherein the state comprises at least one of a first binary state, a second binary state, and an undefined state. The processing unit is further configured to decode at least one portion of data that has an undefined state based on its location and based on the overhead information.

According to an embodiment, each portion of the data is represented by a bit or by a cell of a volatile or non-volatile memory.

According to an embodiment, each portion of the data is represented by a pair of cells of a volatile or non-volatile memory, wherein the undefined state of the portion of data is determined by the pair of memory cells showing the same logical state.

According to an embodiment, each portion of the data is represented by at least two cells of a volatile or non-volatile memory, wherein the undefined state of the portion of data is determined by the memory cells showing a state that is not used in error-free operation.

According to an embodiment, the memory comprises at least one of the following: floating gate cells, PCRAM, RRAM, MRAM, MONOS devices, nanocrystal cells, RAM, and ROM.

A device for data processing, in particular error detection and error correction, is provided. The device comprises means for reading data, the data comprising overhead information and payload information, and means for determining a state of each portion of the data, wherein the state comprises at least one of a first binary state, a second binary state, and an undefined state. The device further comprises means for decoding at least one portion of data that has an undefined state based on its location and based on the overhead information.

Although various example embodiments of the disclosure have been disclosed, it will be apparent to those skilled in the art that various changes and modifications can be made which will achieve some of the advantages of the disclosure without departing from the spirit and scope of the disclosure. It will be obvious to those reasonably skilled in the art that other components performing the same functions may be suitably substituted. It should be mentioned that features explained with reference to a specific figure may be combined with features of other figures, even in those cases in which this has not explicitly been mentioned. Further, the methods of the disclosure may be achieved in either all software implementations, using the appropriate processor instructions, or in hybrid implementations that utilize a combination of hardware logic and software logic to achieve the same results. Such modifications to the inventive concept are intended to be covered by the appended claims.

The invention claimed is:

1. A method for data processing, comprising:
   reading data, the data comprising overhead information and payload information;
   determining a state of each portion of the data, wherein the state comprises at least one of a first binary state, a second binary state, and an undefined state; and
   decoding at least one portion of data that has an undefined state based on its location and based on the overhead information.

2. The method according to claim 1, wherein decoding at least one portion of data comprises determining the payload information.

3. The method according to claim 1, wherein decoding at least one portion of data comprises error detection based on an error correction code.

4. The method according to claim 3, wherein the error correction code is one of the following: a parity code, a Hamming code, an extended Hamming code, a cyclic code, and a block code.

5. The method according to claim 1, wherein each portion of the data is a bit and the overhead information comprises at least one bit.

6. The method according to claim 1, wherein the portion of the data corresponds to a memory cell.

7. The method according to claim 6, wherein the memory cell is a memory cell of a non-volatile memory.

8. The method according to claim 6, wherein the memory cell is part of two memory cells which are used in a differential read memory.

9. The method according to claim 8, wherein the undefined state of a memory cell is determined by a pair of memory cells of the differential read memory showing the same logical state.

10. The method according to claim 8, further comprising decoding at least one portion of data based on different probabilities for the occurrence of different bits in the differential read memory.

11. The method according to claim 8, wherein the differential read memory comprises at least one of the following: floating gate cells, PCRAM, RRAM, MRAM, MONOS devices, nanocrystal cells, RAM, and ROM.

12. The method according to claim 1, wherein decoding comprises detecting an error based on the overhead information and based on the undefined stated of at least one portion of the data.

13. The method according to claim 12, further comprising correcting an error based on the overhead information and based on the position of the portion of data that shows an undefined state.

14. The method according to claim 1,
   wherein reading comprises reading data Y having n bits, k bits of payload information D and one bit of overhead information $r_0$,
   wherein determining comprises determining a state of each bit of the data Y, and
   wherein decoding comprises:
   if all n bits of Y have values out of ["0", "1"] then the following applies:
   if $r_0$=Parity(D), then the payload information D=($d_0$ ... $d_{k-1}$) is assumed to be correct;
   if k−1 bits out of the bits $d_0$ ... $d_{k-1}$ of the payload information plus the overhead information $r_0$ have values from ["0", "1"] and if one bit $d_1$ has an undefined state "X", then $d_1'$=Parity($d_0$ ... $d_{k-1}$, $r_0$)$|_{d_f=0}$ is set and a corrected payload information is determines as D'=($d_0$ ... $d_f'$ ... $d_{k-1}$);
   if all bits of $d_0$ ... $d_{k-1}$ of the payload information have values from ["0", "1"] and $r_0$ has an undefined state "X", then the payload information D=($d_0$ ... $d_{k-1}$) is assumed to be correct.

15. The method according to claim 1 based on a Hamming code with a generator matrix $\underline{A}$ of the Hamming Code, a parity check matrix $\underline{H}$ of the Hamming Code, wherein $\underline{H}$=[$\underline{A}$ $\underline{I}$], with $\underline{I}$ being the identity matrix,
   wherein reading comprises reading data Y having n bits, k bits of payload information D and r bits of overhead information R=($r_0$ ... $r_{r-1}$),
   wherein determining comprises determining a state of each bit of the data Y, and wherein decoding comprises:
  if all n bits of Y have values out of ["0", "1"] the followings applies:
    if a syndrome S fulfills the condition
    $S = \underline{H} Y^T = 0$,
    then the payload information $D=(d_0 \ldots d_{k-1})$ is assumed to be correct;
      else: if the syndrome $S \neq 0$ is equal to a column i of $\underline{H}$, then a single flipped bit is assumed and corrected by inverting bit i of Y;
      else: as an option, if the syndrome $S \neq 0$ is not equal to any column of $\underline{H}$, an unrecoverable data error is determined;
  if n−1 bits of Y have values out of ["0", "1"] and one bit $y_f$ has the undefined state "X", the following applies:
    if a syndrome S fulfills the condition
    $S = \underline{H} Y^T|_{y_f = sv} = 0$, with sv=["0", "1"]
    then $y_f' = sv$ is set;
      else: if the syndrome $S \neq 0$ is equal to a column f of $\underline{H}$, then $y_f' = 1-sv$ is set;
      else: as an option, an unrecoverable data error is determined;
  if n−2 bits of Y have values out of ["0", "1"] and two bits $y_{f1}$ and $y_{f2}$ are undefined bits "X", the following applies:
    if a syndrome S fulfills the condition
    $S = \underline{H} Y^T|_{y_{f1}=sv1; y_{f2}=sv2} = 0$, with sv1 and sv2=["0", "1"]
    then $y_{f1}' = sv1$ and $y_{f2}' = sv2$ are set;
      else: if the syndrome $S \neq 0$ is equal to column f1 of $\underline{H}$, then $y_{f1}' = 1-sv1$ and $y_{f2}' = sv2$ are set;
      else: if the syndrome $S \neq 0$ is equal to column f2 of $\underline{H}$, then $y_{f1}' = sv1$ and $y_{f2}' = 1-sv2$ are set;
      else: if the syndrome $S \neq 0$ is equal to a modulo-2 sum of the columns f1 and f2 of $\underline{H}$, then $y_{f1}' = 1-sv1$ and $y_{f2}' = 1-sv2$ are set;
      else: as an option, an unrecoverable data error is determined.

16. The method according to claim 1 based on an extended Hamming Code with a generator matrix $\underline{A}$ of the extended Hamming Code and a parity check matrix $\underline{H}$ of the extended Hamming Code, wherein $\underline{H} = [\underline{A} \; \underline{I}]$, with $\underline{I}$ being the identity matrix,
  wherein reading comprises reading data Y having n bits, k bits of payload information D and r bits of overhead information $R = (r_0 \ldots r_{r-1})$,
  wherein determining comprises determining a state of each bit of the data Y, and
  wherein decoding comprises:
    if all n bits of Y have values out of ["0", "1"] the following applies:
      if a syndrome S fulfills the condition
      $S = \underline{H} Y^T = 0$,
      then the payload information $D=(d_0 \ldots d_{k-1})$ is assumed to be correct;
        else: if the syndrome $S \neq 0$ is equal to a column i of $\underline{H}$, then a single flipped bit is assumed and corrected by inverting bit i of Y;
        else: as an option, if the syndrome $S \neq 0$ is not equal to any column of $\underline{H}$, an unrecoverable data error is determined;
    if n−1 bits of Y have values out of ["0", "1"] and one bit $y_f$ has the undefined state "X", the following applies:
      if the syndrome S fulfills the condition
      $S = \underline{H} Y^T|_{y_f = sv} = 0$, with sv=["0", "1"]
      then $y_f' = 0$ is set;
        else: if the syndrome $S \neq 0$ is equal to a column f of $\underline{H}$, then $y_f' = 1-sv$ is set;
        else: if the syndrome $S \neq 0$ is equal to a column i of $\underline{H}$, then $y_f' = sv$ and bit i of Y is inverted;
        else: if the syndrome $S \neq 0$ is equal to a modulo-2 sum of the column f and the column i of $\underline{H}$, then $y_f' = 1-sv$ is set and bit i of Y is inverted;
        else: as an option, an unrecoverable data error is determined;
    if n−2 bits of Y have values out of ["0", "1"] and two bits $y_{f1}$ and $y_{f2}$ are undefined bits "X", the following applies:
      if the syndrome S fulfills the condition
      $S = \underline{H} Y^T|_{y_{f1}=sv1; y_{f2}=sv2} = 0$, with sv1 and sv2 =["0", "1"]
      then $y_{f1}' = sv1$ and $y_{f2}' = sv2$ are set;
        else: if the syndrome $S \neq 0$ is equal to column f1 of $\underline{H}$, then $y_{f1}' = 1-sv1$ and $y_{f2}' = sv2$ are set;
        else: if the syndrome $S \neq 0$ is equal to column f2 of $\underline{H}$, then $y_{f1}' = sv1$ and $y_{f2}' = 1-sv2$ are set;
        else: if the syndrome $S \neq 0$ is equal to a modulo-2 sum of columns f1 and f2 of $\underline{H}$, then $y_{f1}' = 1-sv1$ and $y_{f2}' = 1-sv2$ are set;
        else: as an option, an unrecoverable data error is determined;
    if n−3 bits out of Y have values out of ['0', '1'] and three bits $y_{f1}$, $y_{f2}$, and $y_{f3}$ are 'X', then
      if the syndrome S fulfills the condition
      $S = \underline{H} Y^T|_{y_{f1}=sv1; y_{f2}=sv2; y_{f3}=sv3} = 0$,
      with sv1, sv2, and sv3=["0", "1"],
      wherein $sv_a$ is one out of $sv_i$, with i=1 ... 3, i.e. one out of sv1, sv2 and sv3,
      wherein $sv_b$ is one out of $sv_i$, but different from $sv_a$,
      wherein $sv_{(\neq a)}$ refers to the other $sv_i$ with i≠a,
      wherein $sv_{(\neq a, \neq b)}$ refers to the other $sv_i$ with i≠a and i≠b,
      then $y_{f1}' = sv1$ and $y_{f2}' = sv2$ and $y_{f3}' = sv3$ are set;
        else: if the syndrome $S \neq 0$ is equal to one of the columns fa (a=1, 2, 3) of $\underline{H}$, then $y_{fa}' = 1-sv_a$ and the two other $y_{f(\neq a)}' = sv_{(\neq a)}$ are set;
        else: if the syndrome $S \neq 0$ is equal to a modulo-2 sum of two of the columns fa and fb of $\underline{H}$, then $y_{fa}' = 1-sv_a$ and $y_{fb}' = 1-sv_b$ and the other $y_{f(\neq a, \neq b)}' = sv_{(\neq a, \neq b)}$ are set;
        else: if the syndrome $S \neq 0$ is equal to a modulo-2 sum of all three columns f1, f2, and f3 of $\underline{H}$, then $y_{f1}' = 1-sv1$ and $y_{f2}' = 1-sv2$ and $y_{f3}' = 1-sv3$ are set;
        else: as an option, an unrecoverable data error is determined.

17. The method according to claim 1, wherein the at least one portion of data corresponds to a signal conveyed via a bus line.

18. The method according to claim 17, wherein the bus line is part of two bus lines of a bus system, which utilizes the two bus lines as differential bus lines.

19. The method according to claim 18, wherein the undefined state corresponds to a pair of bus lines showing the same or substantially the same logical signal value.

20. An apparatus for data processing comprising a processing unit configured to:
  read data, the data comprising overhead information and payload information;
  determine a state of each portion of the data, wherein the state comprises at least one of a first binary state, a second binary state, and an undefined state; and
  decode at least one portion of data that has an undefined state based on its location and based on the overhead information.

21. The apparatus according to claim 20, wherein each portion of the data is represented by a bit or by a cell of a volatile or non-volatile memory.

22. The apparatus according to claim 20, wherein each portion of the data is represented by a pair of cells of a volatile or non-volatile memory, wherein the undefined state of the portion of data is determined by the pair of memory cells showing the same logical state.

23. The apparatus according to claim 20, wherein each portion of the data is represented by at least two cells of a volatile or non-volatile memory, wherein the undefined state of the portion of data is determined by the memory cells showing a state that is not used in error-free operation.

24. The apparatus according to claim 21, wherein the memory comprises at least one of the following: floating gate cells, PCRAM, RRAM, MRAM, MONOS devices, nanocrystal cells, RAM, and ROM.

25. A device for data processing, in particular error detection and error correction, the device comprising:
    means for reading data, the data comprising overhead information and payload information;
    means for determining a state of each portion of the data, wherein the state comprises at least one of a first binary state, a second binary state, and an undefined state; and
    means for decoding at least one portion of data that has an undefined state based on its location and based on the overhead information.

\* \* \* \* \*

UNITED STATES PATENT AND TRADEMARK OFFICE
CERTIFICATE OF CORRECTION

PATENT NO. : 9,032,273 B2  
APPLICATION NO. : 14/018811  
DATED : May 12, 2015  
INVENTOR(S) : Jan Otterstedt et al.

Page 1 of 1

It is certified that error appears in the above-identified patent and that said Letters Patent is hereby corrected as shown below:

In the Claims

Column 18, Claim 14, Line 48 Please replace "...if one bit $d_1$ has an undefined..." with --...if one bit $d_f$ has an undefined...--

Column 18, Claim 14, Line 49 Please replace "...then $d_1'$=Parity..." with --...then $d_f'$ = Parity...--

Signed and Sealed this
Twenty-fifth Day of August, 2015

Michelle K. Lee
*Director of the United States Patent and Trademark Office*